United States Patent
Gao

(10) Patent No.: US 11,740,003 B2
(45) Date of Patent: Aug. 29, 2023

(54) OPTIMIZED AIR COOLING UNIT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 115 days.

(21) Appl. No.: 16/921,778

(22) Filed: Jul. 6, 2020

(65) Prior Publication Data

US 2022/0003483 A1      Jan. 6, 2022

(51) Int. Cl.
   *F25D 17/06*     (2006.01)

(52) U.S. Cl.
   CPC .................. *F25D 17/067* (2013.01)

(58) Field of Classification Search
   CPC ...... F25D 17/067; H05K 7/20745; F25B 5/04
   See application file for complete search history.

(56) References Cited

U.S. PATENT DOCUMENTS

| 7,730,731 B1 * | 6/2010 | Bash ..................... F25B 49/025 |
| | | 62/198 |
| 2018/0153059 A1 * | 5/2018 | Dehlsen ............. H05K 7/20754 |

FOREIGN PATENT DOCUMENTS

CN     101516166 B  *  12/2010  ......... H05K 7/20572

OTHER PUBLICATIONS

Translated_Hong (Year: 2010).*

* cited by examiner

*Primary Examiner* — Elizabeth J Martin
*Assistant Examiner* — Samba Gaye
(74) *Attorney, Agent, or Firm* — WOMBLE BOND DICKINSON (US) LLP

(57) ABSTRACT

A cooling unit for a data center comprises a fan section, a set of airstream diversion sections, and a set of cooling sections. The fan section is disposed at a front end of the unit. The set of airstream diversion sections includes one or more main airstream diversion channels and a rear airstream diversion channel. The airstream diversion section is configured to direct airflow from the fan section to the set of cooling sections. The set of cooling sections includes a main cooling section disposed at a side of the unit and a rear cooling section disposed at a rear end of the unit. Cooling modules may be arranged in series within each cooling section and among multiple cooling sections to manage a cooling fluid distribution corresponding to hot air inlets, to achieve more uniform temperature and better thermal management.

12 Claims, 14 Drawing Sheets

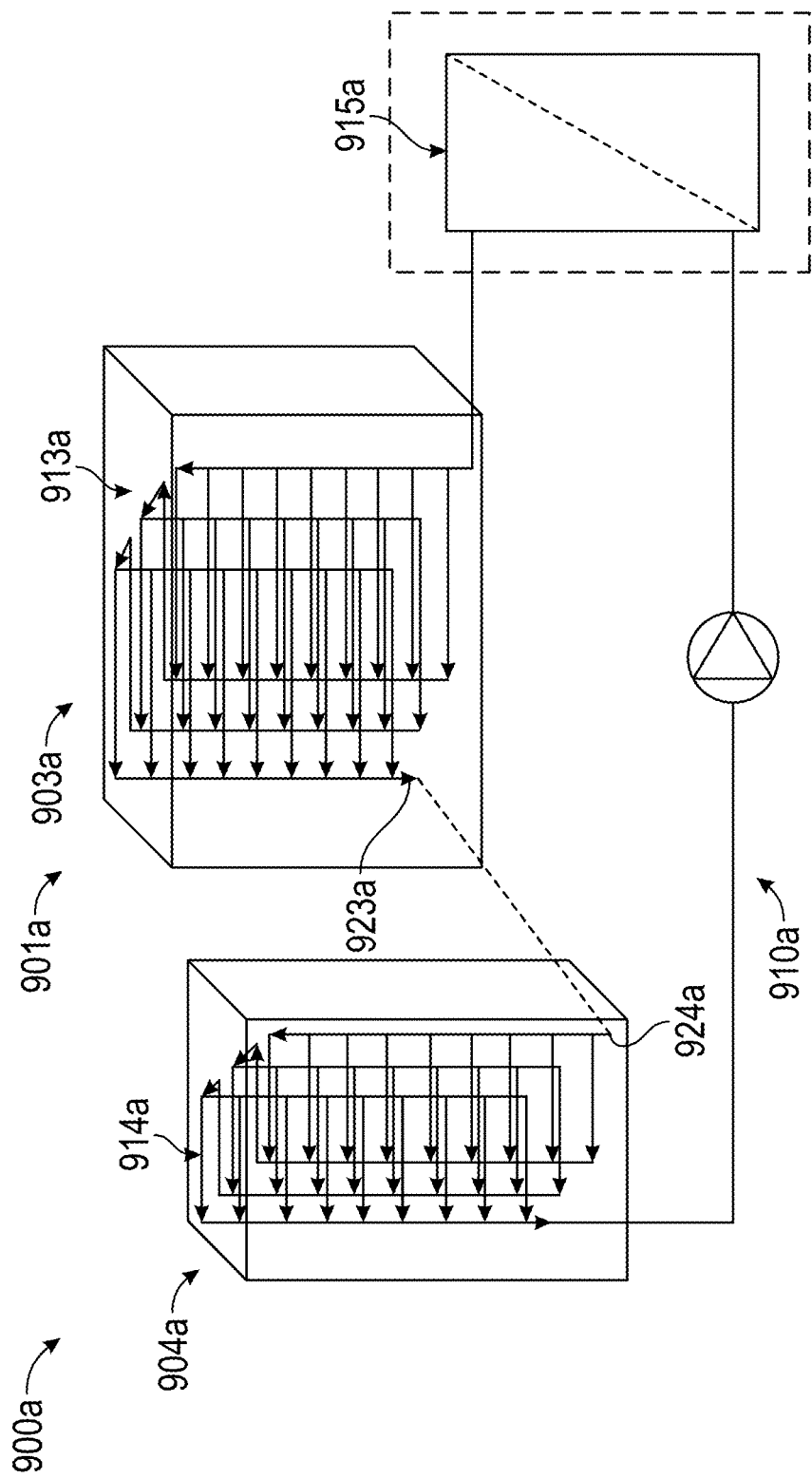

OPTIMIZED AIR COOLING UNIT

FIELD OF THE INVENTION

Embodiments of the present invention relate generally to electronics cooling, data center thermal management and cooling systems. More particularly, embodiments of the invention relate to a cooling unit for component-intensive enclosures.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance, reliability and lifetime. It requires more effective and efficient cooling solutions especially in the cases of cooling these high performance servers.

There are several problems in current cooling systems for a data center. The systems are hardware component-intensive. Thus, an airflow resistance is relatively high and an airflow distribution is in high non-uniformity. Cooling air is supplied from inlets on a frond end of an electronic rack and exists the rack from outlets at a rear end of the electronic rack. Thus, a temperature gradient from the front end to the rear end of the rack is high and non-uniform. The hardware components operate in different thermal environments. Hot spots may be formed at some locations in the data center as well.

BRIEF DESCRIPTION OF THE DRAWINGS

Embodiments of the invention are illustrated by way of example and not limitation in the figures of the accompanying drawings in which like references indicate similar elements.

FIG. 8C is a top view diagram illustrating an example of a main cooling section including multiple cooling modules in a cooling unit according to some embodiments.

FIG. 9A is a diagram illustrating an example of a cooling loop in a cooling unit according to some embodiments.

DETAILED DESCRIPTION

Figure 1:
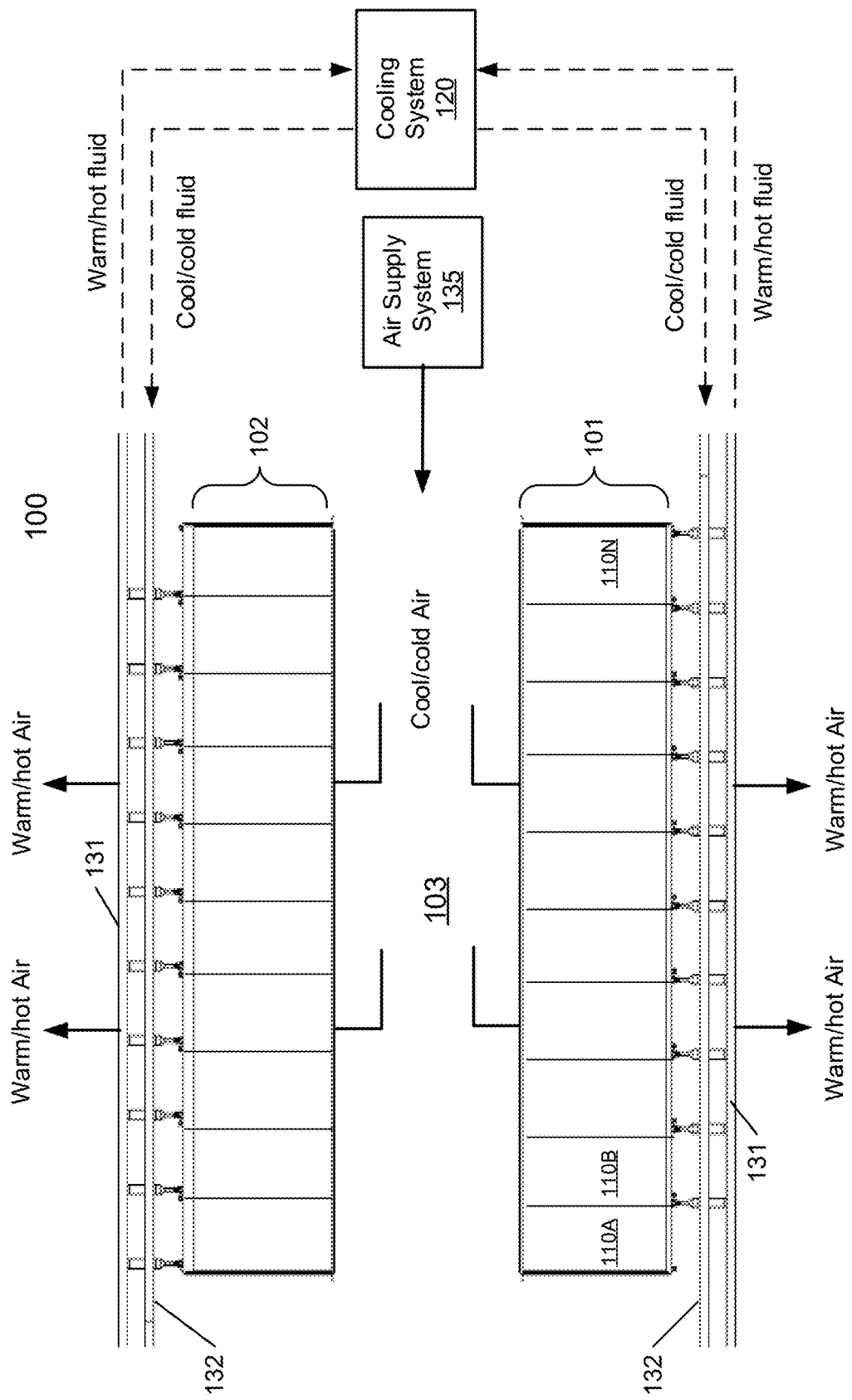
FIG. 1 is a block diagram illustrating an example of a data center facility.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a cooling unit (or an airflow distributor unit) for a data center (or electronic racks) thermal management and airflow management is disclosed. The cooling unit may include a fan section, one or more airstream diversion sections, one or more main cooling sections, and a rear cooling section. The one or more airstream diversion sections may include one or more airstream diversion channels. The one or more airstream diversion channels may be configured to direct airflow to the one or more main cooling sections and the rear cooling section. The one or more main cooling sections and the rear cooling section includes multiple rows of coils. An outlet of the one or more main cooling sections may connect to an inlet of the rear cooling section. The one or more main cooling sections may be connected in series. The cooling unit may be deployed adjacent to electronic racks, or the cooling unit may be a part of an electronic rack. Cooling modules may be arranged in series within each cooling section and among multiple cooling sections to manage a cooling fluid distribution corresponding to hot air inlets, to achieve more uniform temperature and better thermal management.

According to some embodiments, a cooling unit for a data center comprises a fan section, a set of airstream diversion sections, and a set of cooling sections. The fan section is disposed at a front end of the unit. The set of airstream diversion sections includes one or more main airstream diversion channels and a rear airstream diversion channel. The airstream diversion section is coupled to the fan section and the set of cooling sections. The airstream diversion section is configured to direct airflow from the fan section to the set of cooling sections. The set of cooling sections includes a main cooling section disposed at a side of the unit and a rear cooling section disposed at a rear end of the unit. The one or more main airstream diversion channels are coupled to the main cooling section, and the rear airstream diversion channel is coupled to the rear cooling section.

In one embodiment, inlets of the one or more main airstream diversion channels are disposed at a surface parallel to the front end, where outlets of the one or more main airstream diversion channels are disposed at a surface perpendicular to the front end.

In one embodiment, each of the one or more main airstream diversion channels is configured to direct the airflow to enter the main cooling section at a direction perpendicular to a direction from the front end to the rear end.

In one embodiment, each of the one or more main airstream diversion channels has at least a side in an L-shape with a curved corner on a cross section.

In one embodiment, each of the set of cooling sections includes at least one cooling module. In one embodiment, the at least one cooling module includes a plurality of rows of coils, and where the plurality of rows of coils are connected in series. In one embodiment, the at least one cooling module further includes a fluid inlet and a fluid outlet, where the fluid inlet is connected to a first row of coils of the plurality of rows of coils, and wherein the first row of coils is disposed the closest to an air inlet of a corresponding cooling section, such that the first row of coils disposed the closest to the air inlet receives a cooling liquid first. In one embodiment, the plurality of rows of coils includes a first row of coils and a second row of coils, where the first row of coils is disposed closer to an air inlet of a corresponding cooling section than the second row of coils, and where the first row of coils receives a cooling liquid earlier than the second row of coils. In one embodiment, an outlet of the first row of coils is connected to an inlet of the second row of coils, and where the first row of coils is configured to direct the cooling liquid to the second row of coils an outlet of the first row of coils is connected to an inlet of the second row of coils, wherein the first row of coils is configured to direct the cooling liquid to the second row of coils, where the inlet of the second row of coils is disposed on a same side as an inlet of the first row of coils, and wherein, for each of the plurality of rows of coils, an inlet is disposed on a side nearest to a hot aisle. In one embodiment, each of the plurality of rows of coils includes multiple tubes, and wherein a cooling fluid is distributed in the multiple tubes in parallel.

In one embodiment, the main cooling section includes a main cooling module, wherein the rear cooling section includes a rear cooling module, and where a fluid outlet of the main cooling module is connected to a fluid inlet of the rear cooling module.

In one embodiment, the main cooling section includes multiple main cooling modules, wherein the rear cooling section includes a rear cooling module, and where all of the cooling main modules and the rear cooling module are connected in series.

In one embodiment, a fluid outlet of one of the multiple main cooling modules is connected to a fluid inlet of another of the multiple main cooling modules or a fluid inlet of the rear cooling module. In one embodiment, multiple cooling modules are assembled in multiple cooling sections while keeping the same connecting design.

In one embodiment, each of the multiple main cooling modules corresponds to one of the one or more main airstream diversion channels, and where each of the one or more main airstream diversion channels is configured to direct the airflow to a corresponding main cooling module.

In one embodiment, the unit further comprises a cooling loop, where the cooling loop is connected to one or more main cooling modules in the main cooling section or several cooling sections (for FIG. 8C, the cooling section can be separate ones, each one package one cooling module, but the functions are the same), a rear cooling module in the rear cooling section, and a heat exchanger or a cooling fluid distribution unit. For example, the heat exchange may be packaged within the cooling fluid distribution unit.

According to some embodiments, a method of cooling is disclosed. The method includes activating a fan section disposed at a front end of a cooling unit. The method includes directing airflow from the fan section to a set of cooling sections through an airstream diversion section, where the airstream diversion section includes one or more main airstream diversion channels and a rear airstream diversion channel, and where the airstream diversion section is coupled to the fan section and the set of cooling sections. The method further includes cooling the airflow by using the set of cooling sections including a main cooling section disposed at a side of the cooling unit and a rear cooling section disposed at a rear end of the cooling unit, where the one or more main airstream diversion channels are coupled to the main cooling section, and wherein the rear airstream diversion channel is coupled to the rear cooling section. In one embodiment, each of the set of cooling sections includes at least one cooling module, and wherein the cooling the airflow by using the set of cooling sections includes cooling the airflow by using the at least one cooling module in each of the set of cooling sections. The method also includes a cooling coil and fluid flowing coupling design within one cooling module sections and among multiple cooling modules in multiple sections.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

As illustrated in FIG. 1, the cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
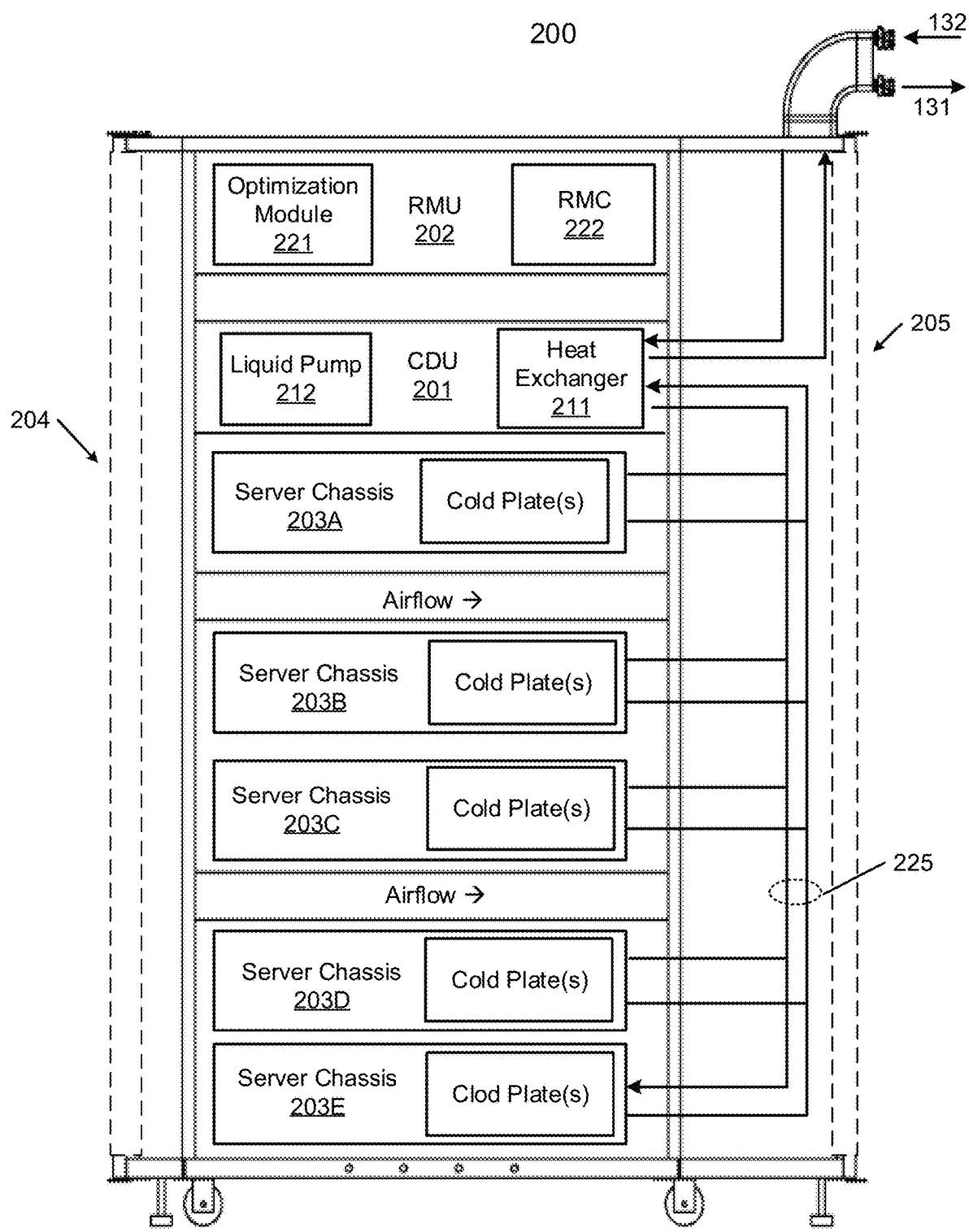
FIG. 2 is a block diagram illustrating an example of an electronic rack.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, a fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, graphic processing units (GPUs), Application specific integrated circuit (ASIC) memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs or ASICs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
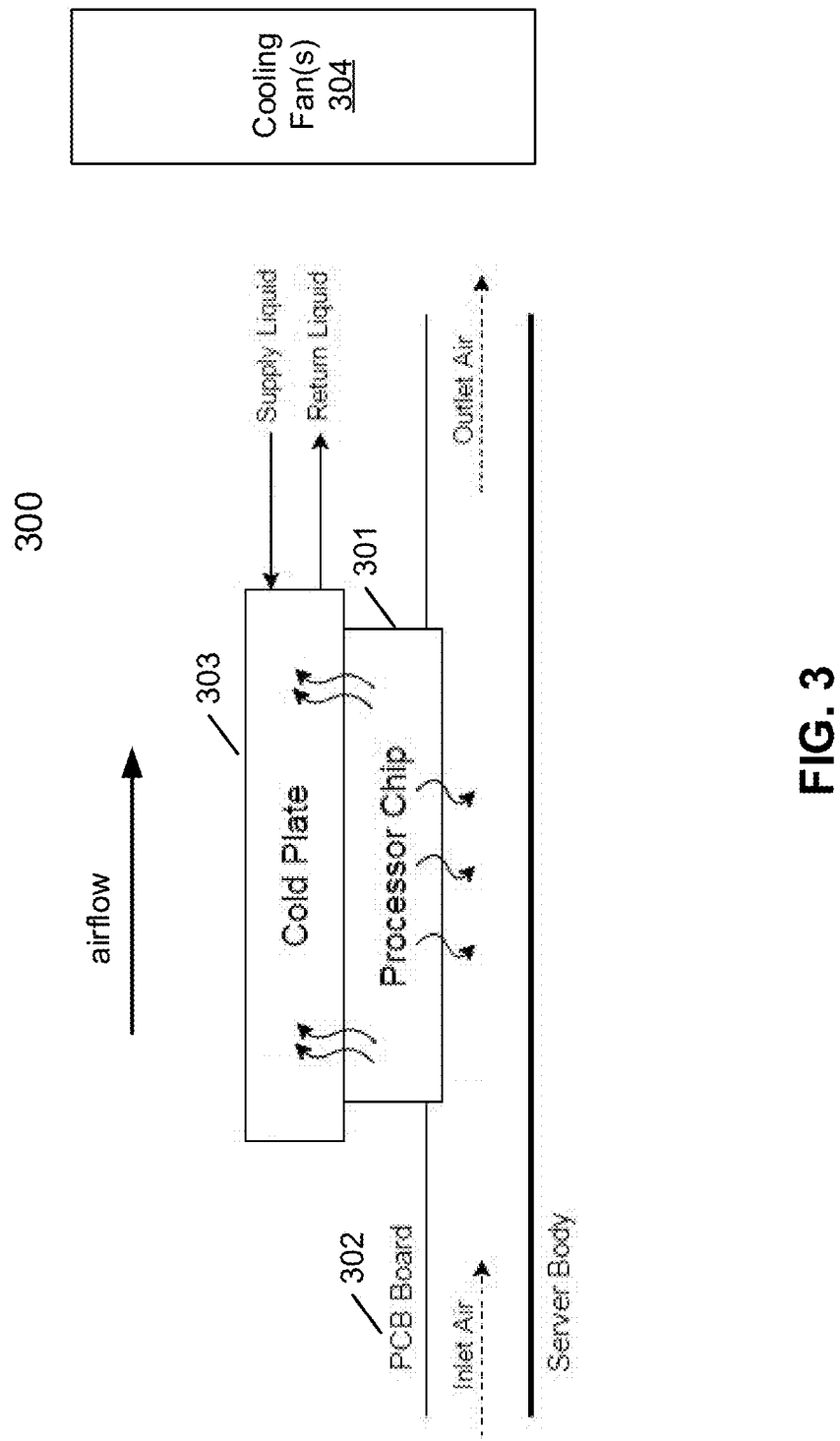
FIG. 3 is a block diagram illustrating an example of a cold plate configuration.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131. A portion of the heat generated by processor 301 is removed by the cooling liquid via cold plate 303. The remaining portion of the heat enters into an air space underneath or above, which may be removed by an airflow generated by cooling fan 304.

There are multiple challenges in cooling systems for a data center, where a cluster or a point of delivery (POD) is deployed with information technology (IT) rack equipment populated with storage devices. The IT equipment is also named as JBOD (just a bunch of disks, or just a bunch of drives). First, a thermal management or cooling design for the IT equipment and/or POD is a challenge. The systems are hardware component-intensive. Therefore, an airflow resistance is relatively high and airflow distribution is in high non-uniformity. The temperature gradient is high and the cooling airflow may be non-uniform across the components, and therefore, the hardware components may operate in different thermal environments. In addition, hot spots may form at some locations where the IT components reside. The second challenge is the electronics packaging requirement. In order to decrease the storage costs and improve the system performance, the packaging density becomes more and more intensive. For example, there may be more than 100 drives packaged in a 4U space, and maybe even more. Thus, a space of implementing advanced thermal management within the rack may be limited. It may be advantageous to have a segregated design of a thermal management system and the IT components. Another challenge is the cost of the cooling systems.

Cooling systems may use either air cooling or hybrid cooling approaches. Currently, the cooling air is supplied from inlets on a frond end of an electronic rack and/or server and exists the server and rack from outlets at a rear end of the electronic rack and/or server. Thus, a temperature gradient from the front end to the rear end is high and non-uniform, and hot spots may be created. There may be a need to develop an efficient cooling unit and an efficient cooling method to optimize airflow distribution to improve cooling efficiency.

Disclosed herein is a cooling unit (or an airflow distributor unit) and a cooling method for a data center (or electronic racks) thermal management and airflow management. The cooling unit/method disclosed herein provides a solution to address the temperature gradient problems in highly component-intensive clusters or PODs thermal management. The cooling unit/method may be deployed in different data center cooling infrastructures.

Figure 4:
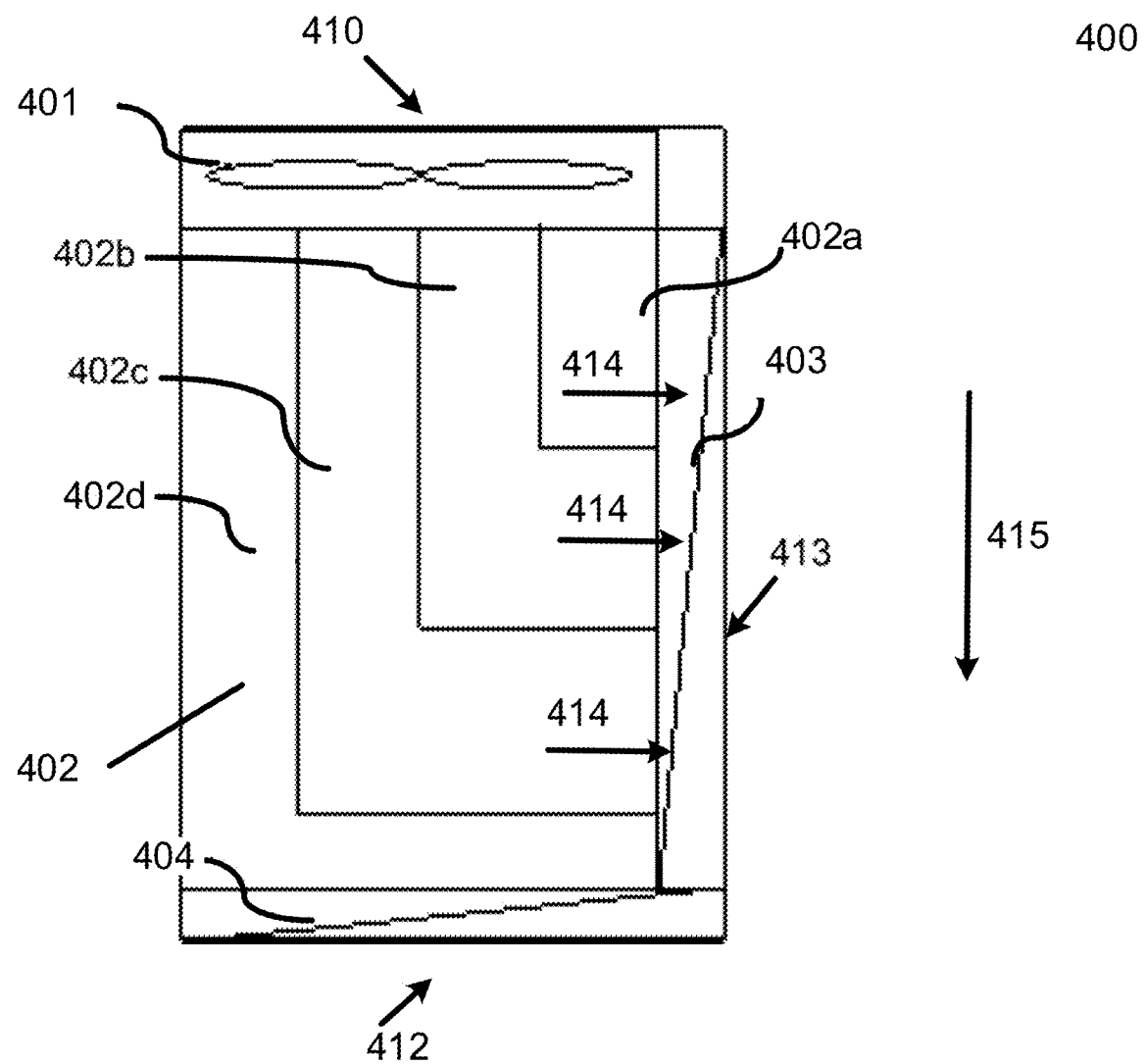
FIG. 4 is a diagram illustrating an example of a cooling unit according to some embodiments.

FIG. 4 is a diagram illustrating an example of a top view of a cooling unit 400 for a data center according to some embodiments. The cooling unit 400 may include multiple sections. In one embodiment, the cooling unit 400 may include a fan section 401, an airstream diversion section 402, and a set of cooling sections (e.g., 403, 404). The set of cooling sections (e.g., 403, 404) may include one or more main cooling sections (e.g., 403) and a rear cooling section (e.g., 404). The airstream diversion section 402 may include one or more main airstream diversion channels (e.g., 402a, 402b, 402c) and a rear airstream diversion channel (e.g., 402d). The fan section 401 may be disposed at a front end 410 of the cooling unit 400. The airstream diversion section 402 may be coupled to the fan section 401 and the set of cooling sections (e.g., 403, 404). The one or more main cooling sections (e.g., 403) are disposed at a side 413 of the unit 400 and the rear cooling section (e.g., 404) is disposed at a rear end 412 of the unit.

There may be one or multiple main airstream diversion channels (e.g., 402a, 402b, 402c) and one rear airstream diversion channel (e.g., 402d) in the airstream diversion section 402. For example, the cooling unit 400 may include three main airstream diversion sections (e.g., 402a, 402b, 402c), as illustrated in FIG. 4. The cooling unit may include different numbers of main airstream diversion channels. The airstream diversion section 402 may be configured to direct airflow from the fan section 401 to the set of cooling sections (e.g., 403, 404). In one embodiment, the one or more main airstream diversion channels (e.g., 402a, 402b, 402c) may be coupled to the one or more main cooling sections (e.g., 403), and the rear airstream diversion channel 402d may be coupled to the rear cooling section 404. The one or more main airstream diversion channels may direct the airflow to the main cooling section 403, and the rear airstream diversion channel (e.g., 402d) may direct the airflow to the rear cooling section 404. Each of the one or more main airstream diversion channels (e.g., 402a, 402b, 402c) may be configured to direct the airflow to the one or more main cooling sections (e.g., 403) at a direction 414 perpendicular to a direction 415 from the front end 410 to the rear end 412 of the unit. The airstream diversion section may distribute and divide the airflow and prevent airflow short path recirculation or vertexes. The airstream diversion channels may deliver airflow to cover all of coils in the set of cooling sections and supply airflow more uniformly. Therefore, a temperature gradient problem and thermal distribution non-uniformity in highly component-intensive clusters or PODs may be solved. In this way, a cooling efficiency of the data center may be improved and hot spots inside the data center may be avoided. More importantly, the hardware devices may operate in substantial uniform thermal environment regardless of their locations.

Figure 5B:
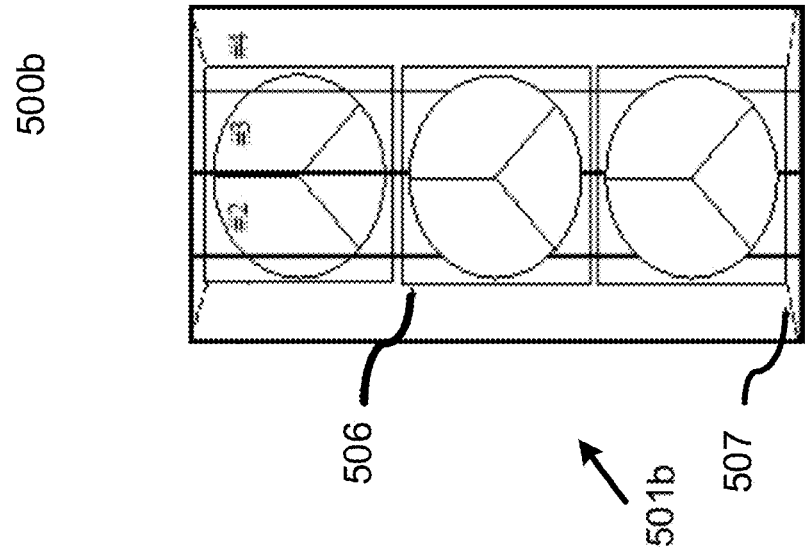
FIG. 5A and FIG. 5B are diagrams illustrating examples of a fan section of a cooling unit according to some embodiments.
Figure 5A:
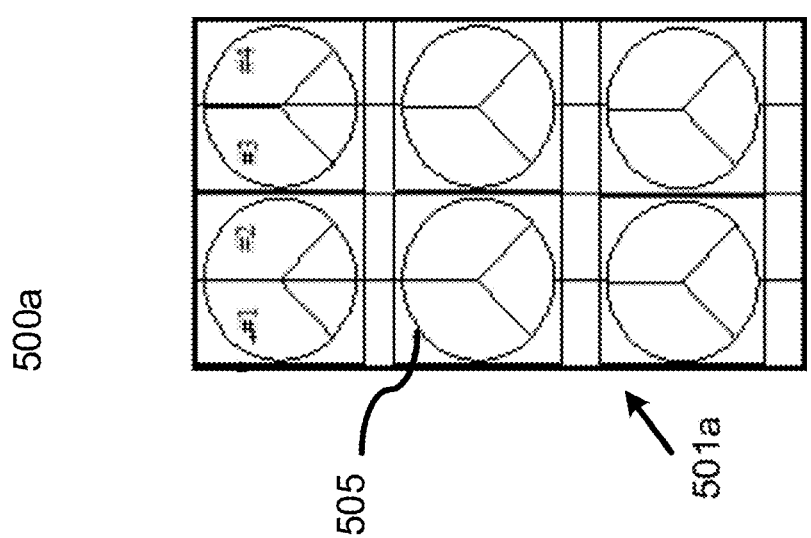

FIG. 5A is a diagram 500a illustrating an example of a front view of a fan section 501a of a cooling unit according to some embodiments. FIG. 5B is a diagram 500b illustrating another example of a front view of a fan section 501b of a cooling unit according to some embodiments. Referring to FIG. 5A and FIG. 5B, the fan section (e.g., 501a, 501b) may include one or more fans (e.g., 505, 506), one or more fan frames (e.g., 507), or one or more inlets (not shown) of airstream diversion channels. Different designs may provide different forms of redundancy for the fan.

As illustrated in FIG. 5A, the one or more fans (e.g., 505) may be sized to match with airstream diversion channels (e.g., two channels). For example, there may be two fans in a row, where the sizes of the two fans may match a width of the unit. In actual design, a detailed selection and design procedure may consider the width of the unit, the numbers of the channels, and/or the size of the fans and fan frames to achieve an optimize design. In one embodiment, a dedicated fan may be selected for each airstream diversion channel. In one embodiment, a fan may be selected for two or multiple airstream diversion channels. When a fan is selected for one or more channels, a size of the fan may be based on the sizes of the one or more channels.

As illustrated in FIG. 5B, the one or more fans (e.g., 506) may be selected based on the entire unit. In one embodiment, a centralized fan may be selected for the entire unit or a portion of the unit. Since a larger fan (e.g., 506) may be selected for a centralized cooling supply, the size of the fan may be more flexible, however, a fan frame maybe needed for guiding air streams. In one embodiment, the fan module 506 and the frames 507 are separate units and hot swappable, this enable ease of service and replacement of the fan if needed.

Figure 6:
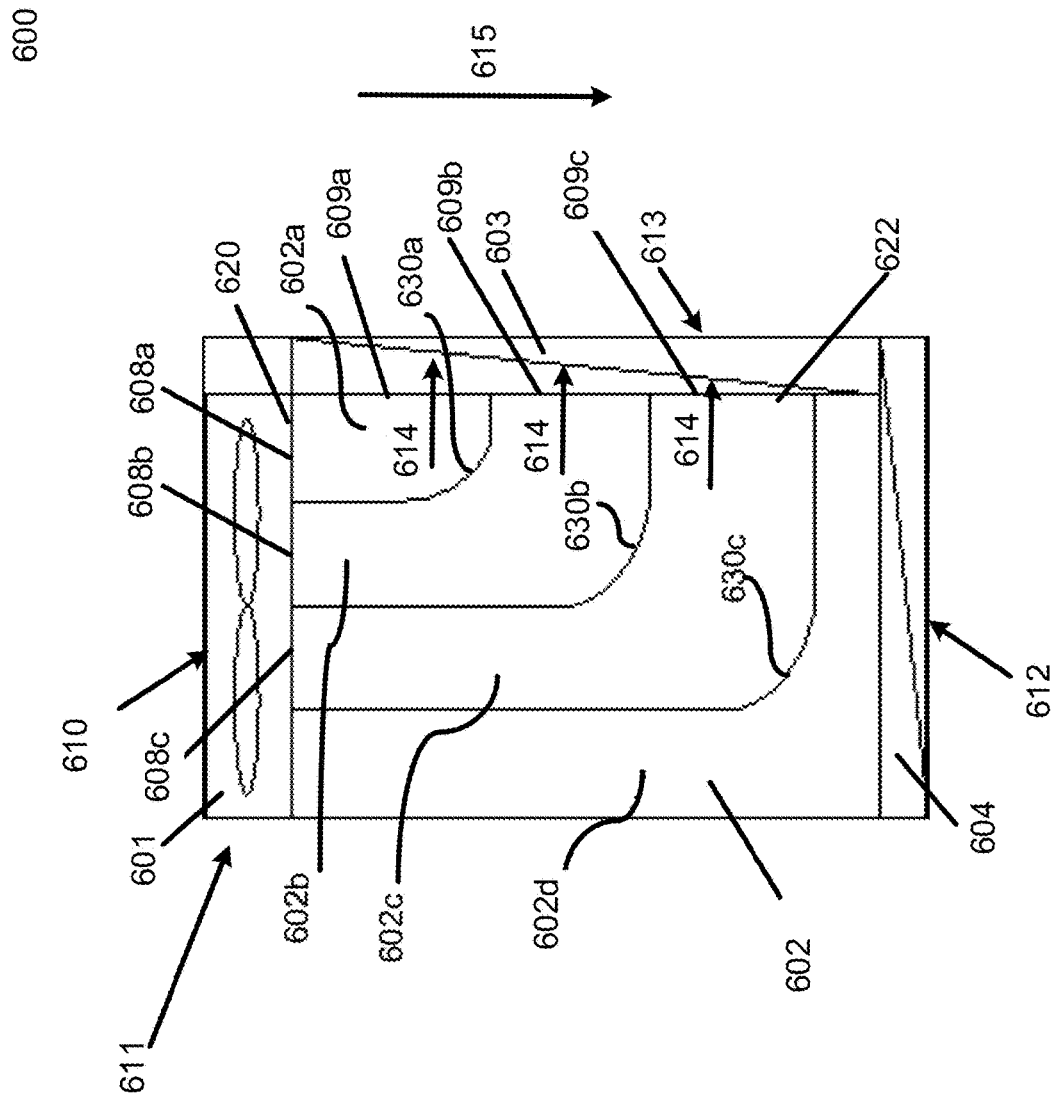
FIG. 6 is a diagram illustrating an example of an airstream diversion section of a cooling unit according to some embodiments.

FIG. 6 is a diagram illustrating an example of a top view of a cross section 611 of an airstream diversion section 602 of a cooling unit 600 for a data center according to some embodiments. The airstream diversion section 602 may include one or more main airstream diversion channels (e.g., 602a, 602b, 602c) and a rear airstream diversion channel (e.g., 602d). The airstream diversion section 602 may be configured to direct airflow from the fan section 601 to the set of cooling sections (e.g., 603, 604). In one embodiment, the one or more main airstream diversion channels (e.g., 602a, 602b, 602c) may be coupled to the one or more main cooling sections (e.g., 603), and the rear airstream diversion channel 602d may be coupled to the rear cooling section 604. The one or more main airstream diversion channels (e.g., 602a, 602b, 602c) may direct the airflow to the main cooling section 603, and the rear airstream diversion channel (e.g., 602d) may direct the airflow to the rear cooling section 604.

As illustrated in FIG. 6, each of the one or more main airstream diversion channels (e.g., 602a, 602b, 602c) may be configured to direct the airflow from the fan section 601 at a frond end 610 of the cooling unit 600 to the one or more main cooling sections (e.g., 603) at a side 613 of the cooling unit 600. Each of the one or more main airstream diversion channels (e.g., 602a, 602b, 602c) may have at least one L-shape side on the cross section 611. The inlets (e.g., 608a, 608b, 608c) of the one or more main airstream diversion channels (e.g., 602a, 602b, 602c) may be disposed at a surface 620 parallel to the front end 610. The outlets (e.g., 609a, 609b, 609c) of the one or more main airstream diversion channels (e.g., 602a, 602b, 602c) may be disposed at a surface 622 perpendicular to the front end 610. Thus, each of the one or more main airstream diversion channels (e.g., 602a, 602b, 602c) may be configured to direct the airflow to the one or more main cooling sections (e.g., 603) at a direction 614 which is perpendicular to a direction 615 from the front end 610 to the rear end 612. Therefore, a temperature gradient from the front end 610 to the rear end 612 may be low. In addition, the cooling air can be divided and distributed to cover all the heat generating components within the server and rack. In this way, a cooling efficiency of the data center may be improved, hot spots inside the data center may be avoided, and air shot path recirculation is prevented.

In one embodiment, each of the one or more main airstream diversion channels (e.g., 602a, 602b, 602c) may have at least one side with an L-shape side and a curved corner (e.g., 630a, 630b, 630c) at the cross section 611. The curved corners (e.g., 630a, 630b, 630c) enable a smooth airflow streamline and prevent airstream vortexes.

Figure 7B:
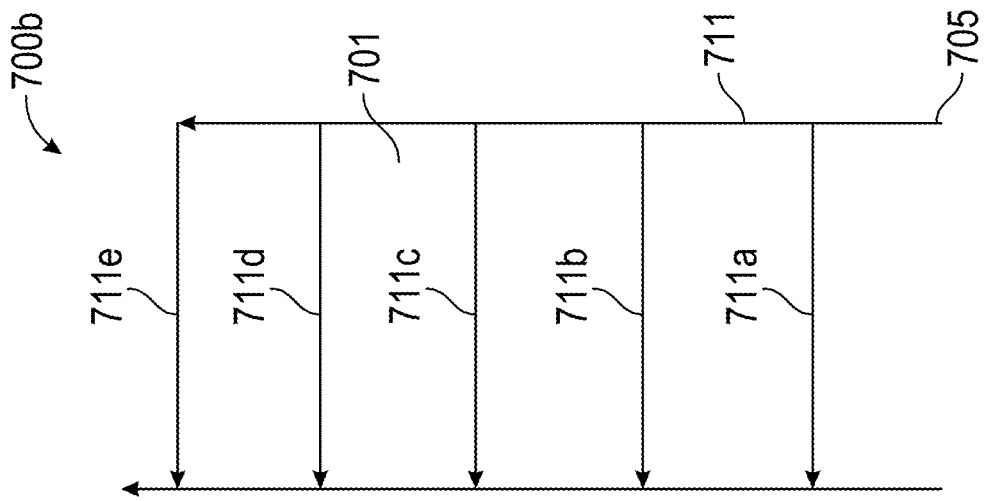
FIGS. 7A-7B are diagrams illustrating an example of a cooling module in a cooling section of a cooling unit according to some embodiments.
Figure 7A:
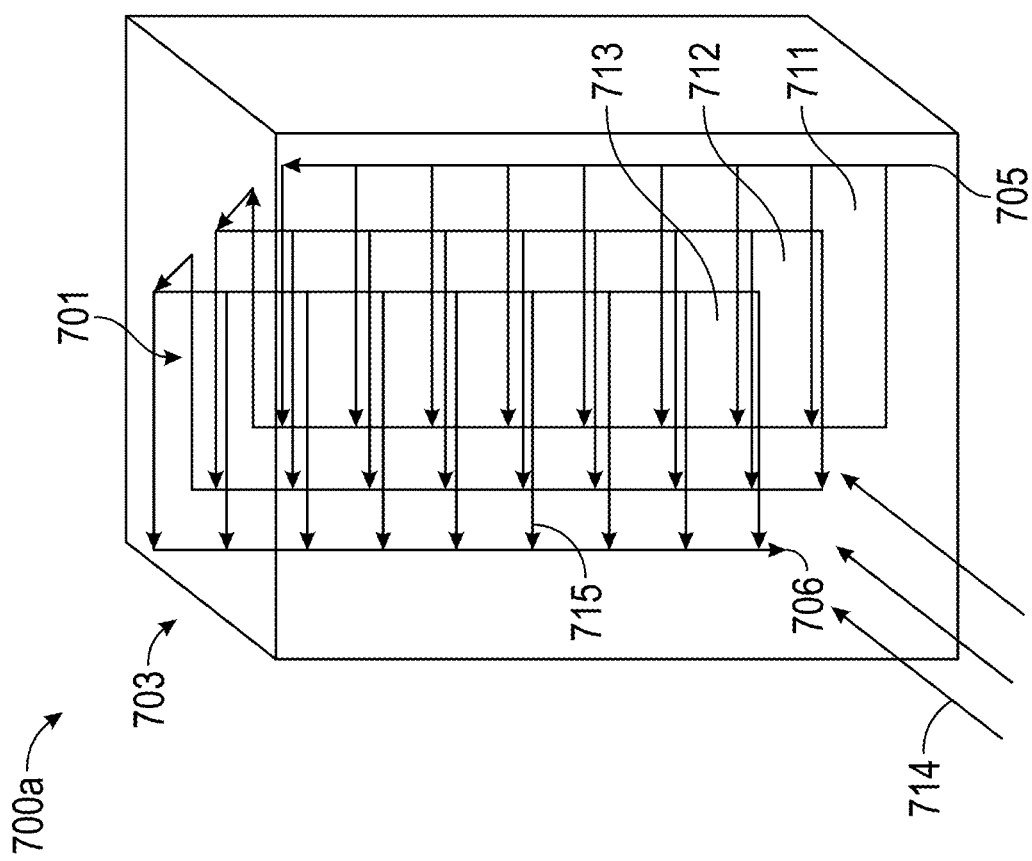

FIGS. 7A-7B are diagrams 700a, 700b illustrating an example of a cooling module 701 in a cooling section 703 of a cooling unit according to some embodiments. FIG. 7A illustrates a three-dimensional view of the cooling module 701. FIG. 7B illustrates a side view of a first row 711 of the cooling module 701. Referring to FIGS. 7A-7B, the cooling unit may include a set of cooling sections such as a main cooling section 703 and a rear cooling section (not shown). Each of the set of cooling sections (e.g., 703) may include at least one cooling module (e.g., 701). In one embodiment, the main cooling section 703 may include one or more main cooling modules. The rear cooling section may include one rear cooling module.

The at least one cooling module (e.g., 701) may include a plurality of rows of coils 715. As illustrated in FIG. 7A, there are three rows of coils (e.g., 711, 712, 713) in the module 701. The number of rows of coils may be 1, 2, 3, 4, 5, 10 or any other numbers. The plurality of rows of coils may be connected in series. Thus, cooling fluid or coolant may be supplied to the plurality of rows of coils (e.g., 711, 712, 713) in series. The supply side should be the side where the hot air stream approaches first. Each of the plurality of rows of coils may include multiple tubes in parallel. For example, referring to FIG. 7B, the first of row of coils 711 includes multiple parallel tubes 711a-711e. The number of the multiple tubes may be 1, 2, 3, 4, 5, 10 or any other numbers.

A fluid inlet 705 of the module may receive cooling fluid from an external cooling supply. The cooling fluid may be parallel distributed in multiple cooling tubes 711a-711e in a first row of coils 711 (e.g., 711 may be approached by hot air 714 first) and then flows to an outlet of the first row of coils 711. The first row of coils 711 may direct the cooling fluid to a second row of coils 712 (e.g., the hot air 714 may approach 712 secondly after 711). After the cooling fluid passes multiple cooling tubes in the second row in parallel, flows to a third row of coils 713 in the same manner. Finally, the cooling fluid leaves the entire cooling module 701 through a fluid outlet 706 of the module.

Figure 8B:
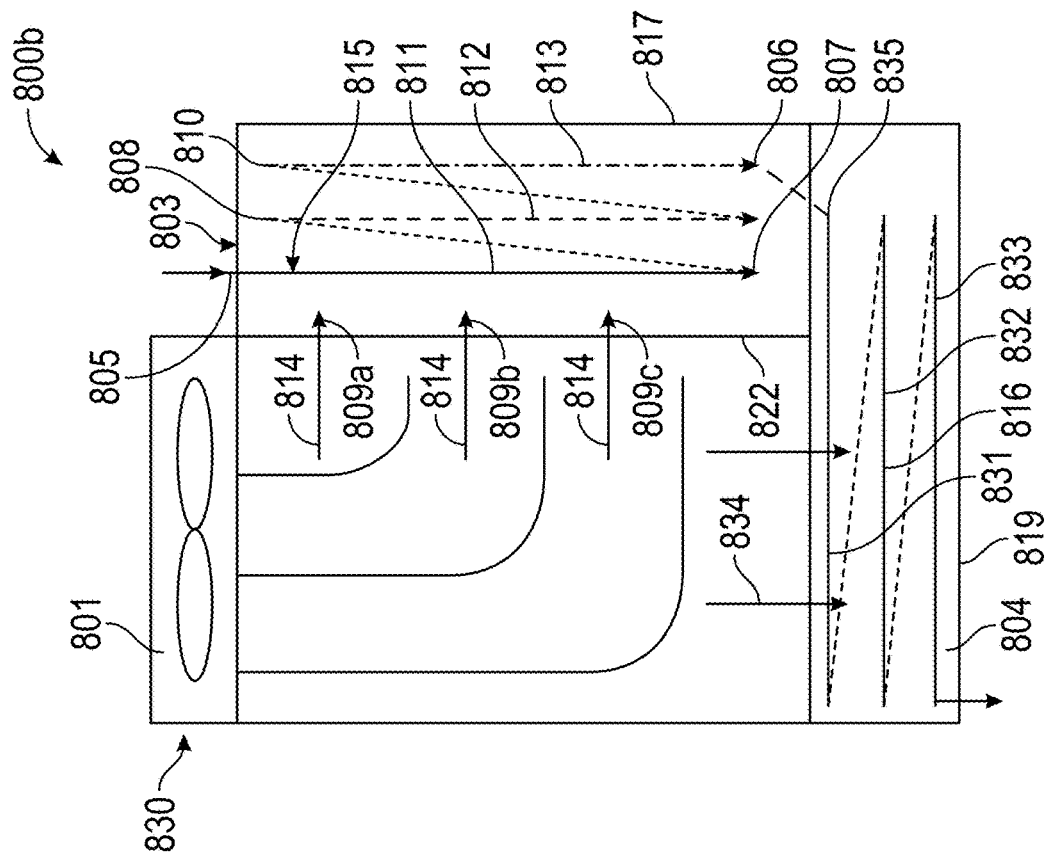
FIGS. 8A-8B are diagrams illustrating an example of a cooling module in a main cooling section of a cooling unit according to some embodiments.
Figure 8A:
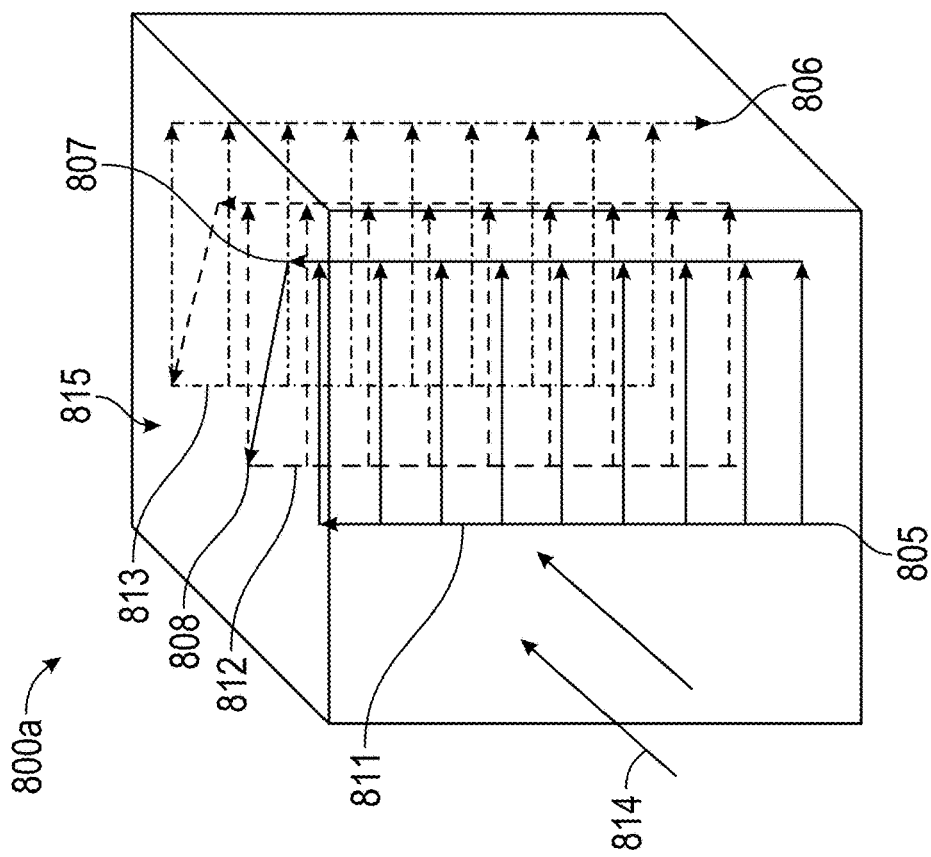

FIGS. 8A-8B are diagrams 800a, 800b illustrating an example of a cooling module 815 in a main cooling section 803 of a cooling unit according to some embodiments. FIG. 8A is a three-dimensional view of the module 815. FIG. 8B is a top view of the module 815. In one embodiment, the main cooling section 803 may be located at a side of the cooling unit. Hot air inlets 809a, 809b, 809c of the main cooling section 803 may be disposed at a side surface 822. Hot air 814 from the fan section 801 may be directed into the main cooling section 803 from the hot air inlets 809a, 809b, 809c. The air may be cooled within the cooling sections and then discharged from the sides 817 and 819. The main cooling section 803 may include the main cooling module 815. The main cooling module 815 may include a plurality of rows of coils 811, 812, 813, for example, a first row 811, a second row 812, a third row 813. The first row of coils 811, which is the closest to the hot air inlets 809a, 809b, 809c, may receive a cooling liquid first. A fluid inlet 805 of module may be connected to the first row 811 of coils that is closest to the hot air inlets. The cooling fluid may go to the first row 811 first. Next, the cooling fluid may go to the second row 812 of coils, which is the second closest row of coils to the hot air inlets. Then, the cooling fluid may go to the third row 813 of coils, which is the third closest row of coils to the hot air inlets. The second row 812 may be connected the first row 811 and the third row 813. If there are only three rows of coils, an outlet 806 of the third row of coils 813 may be connected to an inlet 835 of a rear cooling module 816 in a rear cooling section 804. When a cooling section (e.g., 803) includes a plurality of rows of coils (e.g., 811, 812, 813), the first row of coils (e.g., 811) closest to the air inlets (e.g., 809a-809c) may receive the cooling fluid first. The plurality of rows of coils may be connected in series. When a first row of coils is disposed closer to an air inlet of a corresponding cooling section than a second row of coils, the first row of coils receives a cooling liquid earlier than the second row of coils.

Referring to FIGS. 8A-8B, an outlet 807 of the first row 811 of coils may connected to an inlet 808 of the second row of coils 812. The first row of coils 811 is configured to direct the cooling liquid to the second row of coils 812. The inlet 808 of the second row of coils may be disposed on a same side as the inlet 805 of the first row of coils. For each of the plurality of rows of coils, an inlet (e.g., 805, 808, 810) may be disposed on a side nearest to a hot aisle 830.

The rear cooling module 816 may include a plurality of rows of coils (e.g., 831, 832, 833). The plurality of rows of coils may be similarly connected as described above. When a first row of coils is disposed closer to an air inlet (not shown) of hot air 834 than a second row of coils, the first row of coils may receive the cooling liquid earlier than the second row of coils.

Figure 9B:
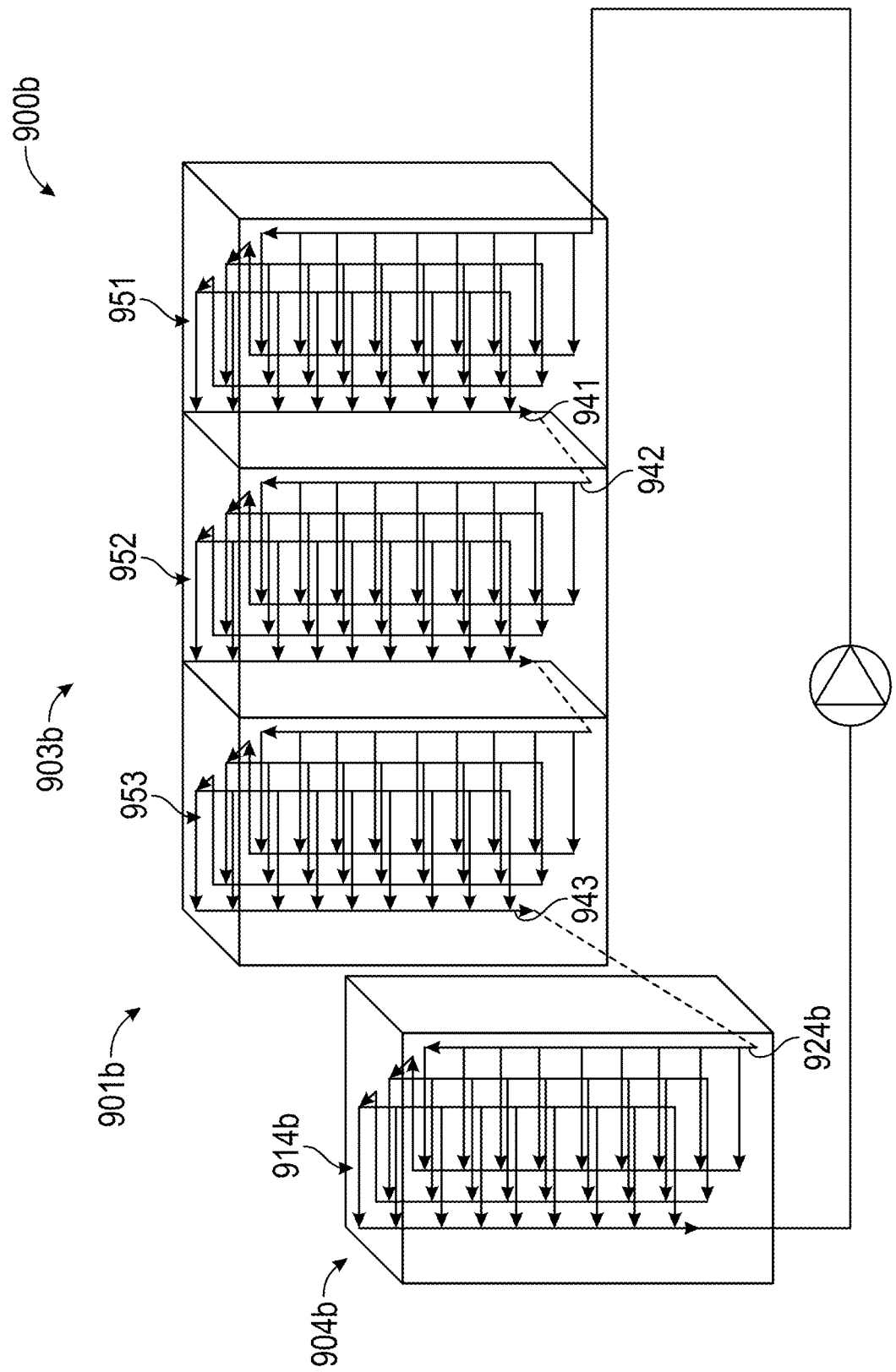
FIG. 9B is a diagram illustrating an example of multiple cooling modules in multiple cooling sections of a cooling unit according to some embodiments.

FIG. 8C is diagram 800c illustrating an example of a main cooling section (e.g., 803c) including multiple cooling modules (e.g., 841, 842, 843) in a cooling unit according to some embodiments. The cooling unit may include a main cooling section (e.g., 803c), a rear cooling section (e.g., 804), a fan section (e.g., 801), and an airstream diversion section (e.g., 802). In one embodiment, the main cooling section (e.g., 803c) may include multiple main cooling modules (e.g., 841, 842, 843), and the rear cooling section (e.g., 804) may include a rear cooling module (e.g., 816). All of the main cooling modules (e.g., 841, 842, 843) and the rear cooling module (e.g., 816) may be are connected in series. The airstream diversion section 802 may include one or more main airstream diversion channels (e.g., 802a, 802b, 802c) and a rear airstream diversion channel (e.g., 802d). In one embodiment, 841, 842 and 843 maybe in separate cooling sections. (as illustrated in FIG. 9B).

For example, a fluid outlet (e.g., 851) of one (e.g., 841) of the multiple main cooling modules may be connected to a fluid inlet (e.g., 852) of another (e.g., 842) of the multiple main cooling modules. For another example, a fluid outlet (e.g., 846) of one (e.g., 843) of the multiple main cooling modules may be connected to or a fluid inlet (e.g., 835) of the rear cooling module (e.g., 804).

As illustrated in FIG. 8C, each of the multiple main cooling modules (e.g., 841, 842, 843) may correspond to one of the one or more main airstream diversion channels (e.g., 802a, 802b, 802c), and each of the one or more main airstream diversion channels (e.g., 802a, 802b, 802c) may configured to direct the airflow 814 to a corresponding main cooling module (e.g., 841, 842, 843). Comparing 841, 842, and 843, 841 receives the cooling fluid first since its location nearest to hot aisle, and then 842 and then 843.

FIG. 9A is a diagram 900a illustrating an example of a cooling loop 910a in a cooling unit 901a according to some embodiments. The cooling unit 901a may include a main cooling section 903a and a rear cooling section 904a. The main cooling section may include one or more cooling modules. The rear cooling section may include one cooling module. In one embodiment, the main cooling section may include one cooling module, a fluid outlet of the cooling module in the main cooling section may be connected to a fluid inlet of a cooling module of the rear cooling section.

As illustrated in FIG. 9A, the main cooling section 903a include a main cooling module 913a, and the rear cooling section 904a include a rear cooling module 914a. A fluid outlet 923a of the main cooling module 913a is connected to a fluid inlet 924a of the rear cooling module. The cooling loop 910a may be used within the unit for completing the fluid system. In one embodiment, the loop 910a may be connected to a heat exchanger 915a. The heat exchanger 915a may be included in the unit or from an external cooling unit. The loop 910a may be connected to the external cooling unit in multiple ways. This can be understood as that the cooling coils in the cooling modules 913a and 914a are connected in series in terms of the fluid loop. Therefore, the fluid temperatures within the cooling coils in the cooling modules 913a and 914a are increasing.

FIG. 9B is a diagram 900b illustrating an example of multiple cooling modules (e.g., 951, 952, 953, 914b) of a cooling unit 901b according to some embodiments. The cooling unit 901b may include a main cooling section 903b and a rear cooling section 904b. The main cooling section 903b may include multiple cooling modules 951, 952, 953. The rear cooling section 904b may include one cooling module 914b. All the cooling modules 951, 952, 953 and 914b may be connected in series. Directly fluid connections are used among the cooling modules 951, 952, 953 and 914b.

In one embodiment, the main cooling section 903b includes multiple cooling modules (e.g., 951, 952, 953), a fluid outlet of one of the multiple cooling modules may be connected to a fluid inlet of another of the multiple cooling modules or a cooling module of the rear cooling section. As illustrated in FIG. 9B, a fluid outlet 941 of the main cooling module 951 is connected to a fluid inlet 942 of the main cooling module 952. A fluid outlet 943 of the main cooling module 953 is connected to a fluid inlet 924b of the rear cooling module 914b. This can be understood as that the coils in the modules 951, 952, 953 and 914b are connected in series, thus, the fluid temperatures are increasing in the modules 951, 952, 953 and 914b. In another embodiment, the 951, 952, 953 may be integrated into one module. In another embodiment, the 951, 952, 953 may be individual cooling sections arranged and assembled together.

In one embodiment, each of the multiple main cooling modules corresponds to one of the one or more main airstream diversion channels. Each of the one or more main airstream diversion channels is configured to direct the airflow to a corresponding main cooling module. For example, referring to FIG. 6 and FIG. 9B, each of the one or more main airstream diversion channels (e.g., 602a, 602b, 602c) may direct the airflow to a corresponding main cooling module (e.g., 951, 952, 953).

The multiple cooling modules (e.g., 951, 952, 953, 914b) may be pre-assembled using hard-piping for assembled using flexible hoses with blind-mating or manual mating connectors. As illustrated in FIG. 9B, a cooling loop 910b may be formed by connecting to an open loop source.

The cooling loop 910b may be used for a supply of cooling fluid and a return connection between the one or more main cooling modules, the rear cooling module and a heat exchanger or an external cooling unit. The external cooling unit may be a liquid to liquid heat exchanger, or a direct connection to POD cooling resources. The operating cooling fluid may be either a single phase or two phase liquid.

Figure 10:
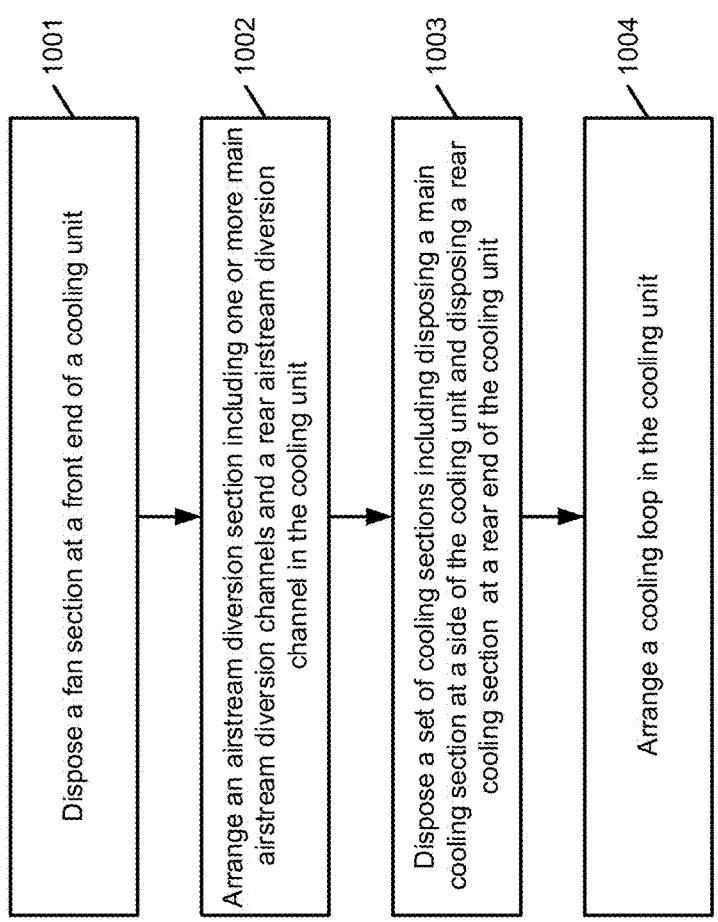
FIG. 10 is a flow diagram illustrating an example of a method of designing or manufacturing a cooling unit according to some embodiments.

FIG. 10 is a flow diagram 1000 illustrating an example of a method of designing or manufacturing a cooling unit according to some embodiments. The cooling unit may include a fan section, an airstream diversion section, and a set of cooling sections. The set of cooling sections may include one or more main cooling sections and a rear cooling section. The airstream diversion section may include one or more main airstream diversion channels and a rear airstream diversion channel.

At 1001, the fan section may be disposed at a front end of the cooling unit. The fan section may include one or more fans. The fan section including one or more fans are used to move the air flow. The one or more fans may be sized to match with airstream diversion channels. For example, there may be two fans in a row, where the sizes of the two fans may match a width of the unit. In actual design, a detailed selection and design procedure may consider the width of the unit, the numbers of the channels, and/or the size of the fans and fan frames to achieve an optimize design. In one embodiment, a dedicated fan may be selected for each airstream diversion channel. In one embodiment, a fan may be selected for two or multiple airstream diversion channels. When a fan is selected for one or more channels, a size of the fan may be based on the sizes of the one or more channels. The one or more fans may be selected based on the entire unit. In one embodiment, a centralized fan may be selected for the entire unit.

At 1002, an airstream diversion section including one or more main airstream diversion channels and a rear airstream diversion channel is arranged in the cooling unit. The airstream diversion section may be configured to distribute and divide the airflow. The airstream diversion section may be configured to direct the airflow from the fan section to the set of cooling sections. In one embodiment, the one or more main airstream diversion channels may be coupled to the one or more main cooling sections and the rear airstream diversion channel may be coupled to the rear cooling section. The one or more main airstream diversion channels may direct the airflow to the main cooling section, and the rear airstream diversion channel may direct the airflow to the rear cooling section. In one embodiment, each of the one or more main airstream diversion channels may have at least one side with an L-shape side and a curved corner at the cross section. The curved corners enable a smooth airflow streamline and prevent airstream vortexes. The airstream diversion section is configured to prevent airflow short path recirculation, deliver the airflow to cover all of cooling modules in the cooling sections, and supply the airflow more uniformly to components in a data center.

In one embodiment, each of the one or more main airstream diversion channels may be configured to direct the airflow from the fan section to the one or more main cooling sections at a direction perpendicular to a direction from the front end to the rear end of the cooling unit. Therefore, a temperature gradient may be low or substantially uniform. In this way, a cooling efficiency of the data center may be improved and hot spots inside the data center may be avoided.

At 1003, a set of cooling sections including a main cooling section and a rear cooling section is disposed. A main cooling section is disposed at a side of the cooling unit and a rear cooling section is disposed at a rear end of the cooling unit. Each of the set of cooling sections may include at least one cooling module. In one embodiment, the main cooling section may include one or more cooling modules. The rear cooling section may include one cooling module. The at least one cooling module may include a plurality of rows of coils. The plurality of rows of coils may be connected in series. Thus, cooling fluid or coolant may be supplied to the plurality of rows of coils in series. The supply side may approach hot air first.

In one embodiment, the at least one cooling module further includes a fluid inlet and a fluid outlet, where the fluid inlet is disposed close to the fan section, and where the fluid outlet is disposed close to the rear cooling section or another cooling module.

In one embodiment, the main cooling section may include one cooling module, a fluid outlet of the cooling module in the main cooling section may be connected to a fluid inlet of a cooling module of the rear cooling section.

In one embodiment, the main cooling section includes multiple cooling modules, a fluid outlet of one of the multiple cooling modules may be connected to a fluid inlet of another of the multiple main cooling modules or a rear cooling module of the rear cooling section.

In one embodiment, each of the multiple main cooling modules corresponds to one of the one or more main airstream diversion channels. Each of the one or more main airstream diversion channels is configured to direct the airflow to a corresponding main cooling module.

At 1004, a cooling loop is arranged in the cooling unit. The cooling loop may be connected to one or more main cooling modules in the main cooling section, a rear cooling module in the rear cooling section, and a heat exchanger. The cooling loop may be used for a supply of cooling fluid and a return connection between the one or more main cooling modules, the rear cooling module and a heat exchanger or an external cooling unit. The external cooling unit may be a liquid to liquid heat exchanger, or a direct connection to POD cooling resources. The operating cooling fluid may be either a single phase or two phase liquid.

Figure 11:
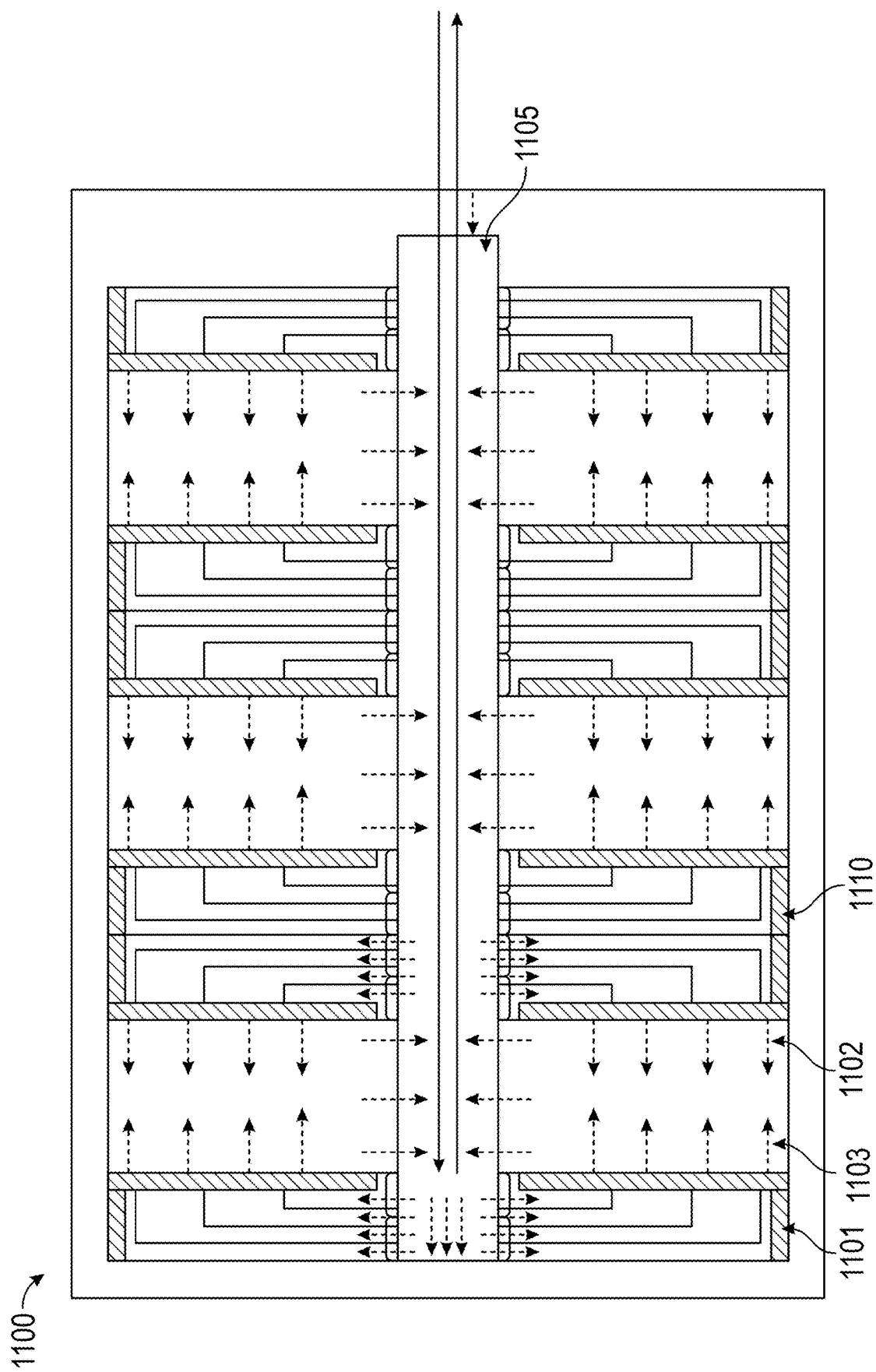
FIG. 11 is a block diagram illustrating an example of a POD level schematic including cooling units according to some embodiments.
Figure 12:
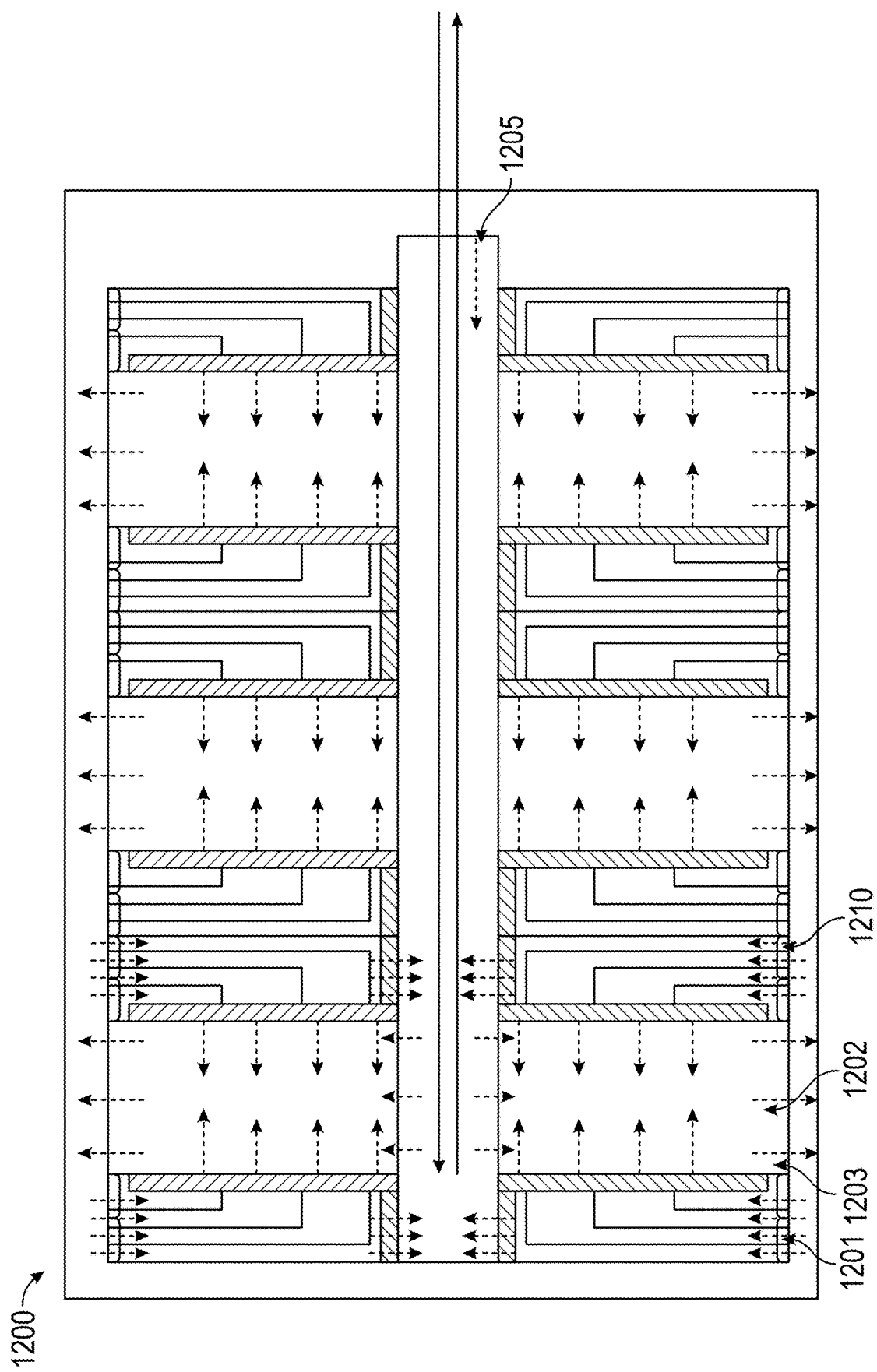
FIG. 12 is a block diagram illustrating another example of a POD level schematic including cooling units according to some embodiments.

FIG. 11 is a block diagram 1100 illustrating an example of a POD level schematic including cooling units according to some embodiments. FIG. 12 is a block diagram 1200 illustrating another example of a POD level schematic including cooling units according to some embodiments. Referring to FIG. 11 and FIG. 12, cooling units (e.g., 1101, 1201) as described in connection with FIGS. 4-10 may be deployed in a POD (e.g., 1110, 1210) in a data center. FIG. 11 illustrated a hot aisle (e.g., 1105) contained environment. FIG. 12 illustrated a cold aisle (e.g., 1205) contained environment.

In one embodiment, cooling units (e.g., 1101, 1201) may be deployed adjacent to electronic racks (e.g., 1102, 1202), in the hot aisle contained environment as illustrated in FIG. 11, or in the cold aisle contained environment as illustrated in FIG. 12, respectively. Either type of containment environment may be used. Airflow (e.g., 1103, 1203) may be supplied to IT components in the electronic racks (e.g., 1102, 1202) in a direction perpendicular to a direction from a front end to a rear end of the racks. The cooling units provide thermal management for the component-intensive data center with low temperature gradient and high cooling efficiency.

In one embodiment, cooling units may be integrated with electronic racks and be a part of the electronic racks. The electronic rack may be assembled with one cooling unit on one side, or two cooling units on both sides. The containment solution may be implemented and designed in different manners, for example a modular containment may be applied to a single rack, several racks, and a row of racks. Cooling loops may be integrated into the cooling units in different methods and locations.

Figure 13:
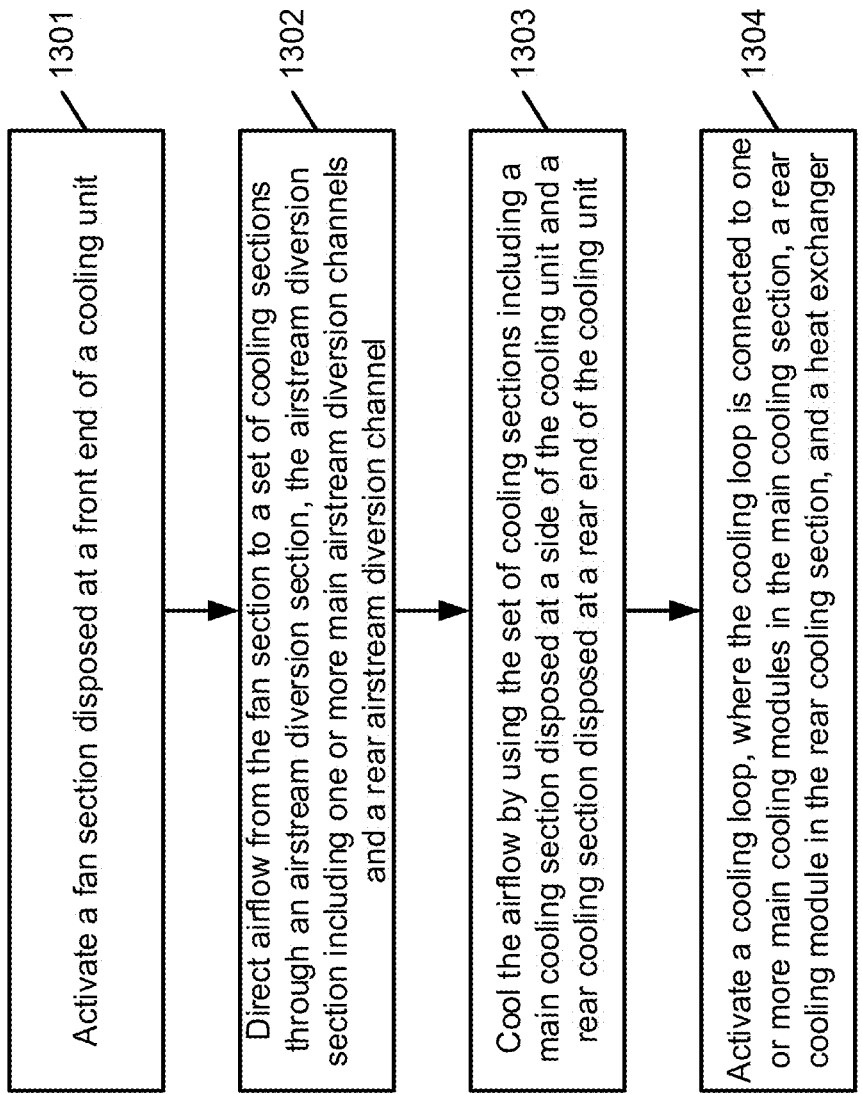
FIG. 13 is a flow diagram illustrating an example of a method of cooling according to some embodiments.

FIG. 13 is a flow diagram illustrating an example of a method of cooling, for example, cooling components in an electronic rack in data center by using a cooling unit, according to some embodiments. The cooling unit may include a fan section, an airstream diversion section, and a set of cooling sections. The set of cooling sections may include one or more main cooling sections and a rear cooling section. The airstream diversion section may include one or more main airstream diversion channels and a rear airstream diversion channel. By this method, a temperature gradient from a front end to a rear end of the electronic rack may be low or substantially uniform. In this way, a cooling efficiency of the data center may be improved and hot spots inside the data center may be avoided.

At 1301, a fan section disposed at a front end of the cooling unit may be activated. The fan section may include one or more fans. The fan section including one or more fans are used to move the air flow. The one or more fans may be sized to match with airstream diversion channels. In one embodiment, a dedicated fan may be selected for each airstream diversion channel. In one embodiment, a centralized fan may be selected for the entire unit.

At 1302, airflow may be directed from the fan section to a set of cooling sections through an airstream diversion section. The airstream diversion section may include one or more main airstream diversion channels and a rear airstream diversion channel. The airstream diversion section may be coupled to the fan section and the set of cooling sections. The airstream diversion section may be configured to direct the airflow from the fan section to the set of cooling sections. In one embodiment, the one or more main airstream diversion channels may be coupled to the one or more main cooling sections and the rear airstream diversion channel may be coupled to the rear cooling section. The one or more main airstream diversion channels may direct the airflow to the main cooling section, and the rear airstream diversion channel may direct the airflow to the rear cooling section.

In one embodiment, the directing the airflow from the fan section to the set of cooling sections includes directing the airflow to enter the main cooling section at a direction perpendicular to a direction from the front end to the rear end.

At 1303, the airflow is cooled by using the set of cooling sections including a main cooling section disposed at a side of the cooling unit and a rear cooling section disposed at a rear end of the cooling unit, where the one or more main airstream diversion channels are coupled to the main cooling section, and where the rear airstream diversion channel is coupled to the rear cooling section. The airflow is cooled by the cooling modules in the cooling sections of the cooling unit and then discharged to the opposite side of hot air inlet of the cooling section. The cooling air discharged by the rear cooling section is delivered to the cold aisle and the cooling air discharged by the cooling sections is delivered directly to the rack adjacent to it, such as the left or right side of a rack.

In one embodiment, each of the set of cooling sections includes at least one cooling module, and where the cooling the airflow includes cooling the airflow by using the at least one cooling module in each of the set of cooling sections.

In one embodiment, the at least one cooling module includes a plurality of rows of coils, and where the cooling the airflow by using the at least one cooling module includes cooling the airflow by using the plurality of rows of coils in series.

In one embodiment, the main cooling section includes multiple main cooling modules, where the rear cooling section includes a rear cooling module, and where the cooling the airflow by using the set of cooling sections includes cooling the airflow by using all of the cooling main modules and the rear cooling module in series.

In one embodiment, the cooling the airflow by using the cooling main modules and the rear cooling module in series includes connecting a fluid outlet of one of the multiple main cooling modules to a fluid inlet of another of the multiple main cooling modules or a fluid inlet of the rear cooling module.

In one embodiment, each of the multiple main cooling modules corresponds to one of the one or more main airstream diversion channels, and where the directing the airflow from the fan section to the set of cooling sections includes directing the airflow from each of the one or more main airstream diversion channels to a corresponding main cooling module.

At 1304, a cooling loop is activated in the cooling unit. The cooling loop may be connected to one or more main cooling modules in the main cooling section, a rear cooling module in the rear cooling section, and a heat exchanger. The cooling loop may be used for a supply of cooling fluid and a return connection between the one or more main cooling modules, the rear cooling module and a heat exchanger or an external cooling unit.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling unit comprising:
 a fan section disposed at a front end of the cooling unit;
 an airstream diversion section including one or more main airstream diversion channels and a rear airstream diversion channel, the airstream diversion section being coupled to the fan section and a set of cooling sections, the airstream diversion section being configured to direct an airflow from the fan section to the set of cooling sections; and
 the set of cooling sections including a main cooling section disposed at a side of the cooling unit and a rear cooling section disposed at a rear end of the cooling unit, wherein the one or more main airstream diversion channels are coupled to the main cooling section, wherein the rear airstream diversion channel is coupled to the rear cooling section, wherein the main cooling section includes a main cooling module, wherein the rear cooling section includes a rear cooling module, wherein a fluid outlet of the main cooling module disposed at the side of the cooling unit is connected to a fluid inlet of the rear cooling module disposed at the rear end of the cooling unit, wherein each of the main cooling module and the rear cooling module includes a plurality of rows of coils, wherein each of the plurality of rows of coils includes multiple tubes, and wherein a cooling fluid is distributed in the multiple tubes in parallel.

2. The cooling unit of claim 1, wherein inlets of the one or more main airstream diversion channels are disposed at a surface parallel to the front end, wherein outlets of the one or more main airstream diversion channels are disposed at a surface perpendicular to the front end.

3. The cooling unit of claim 1, wherein each of the one or more main airstream diversion channels is configured to direct the airflow to enter the main cooling section at a direction perpendicular to a direction from the front end to the rear end.

4. The cooling unit of claim 1, wherein, each of the one or more main airstream diversion channels has at least a side in an L-shape with a curved corner on a cross section.

5. The cooling unit of claim 1, wherein each cooling section of the set of cooling sections includes at least one cooling module.

6. The cooling unit of claim 5, wherein the at least one cooling module includes a plurality of rows of coils, and wherein the plurality of rows of coils are connected in series.

7. The cooling unit of claim 6, wherein the at least one cooling module further includes a fluid inlet and a fluid outlet, wherein the fluid inlet is connected to a first row of coils of the plurality of rows of coils, and wherein the first row of coils is disposed the closest to an air inlet of a corresponding cooling section, such that the first row of coils disposed the closest to the air inlet receives a cooling liquid first.

8. The cooling unit of claim 6, wherein the plurality of rows of coils includes a first row of coils and a second row of coils, wherein the first row of coils is disposed closer to an air inlet of a corresponding cooling section than the second row of coils, and wherein the first row of coils receives a cooling liquid earlier than the second row of coils.

9. The cooling unit of claim 8, wherein an outlet of the first row of coils is connected to an inlet of the second row of coils, wherein the first row of coils is configured to direct the cooling liquid to the second row of coils, wherein the inlet of the second row of coils is disposed on a same side as an inlet of the first row of coils, and wherein, for each of the plurality of rows of coils, an inlet is disposed on a side nearest to a hot aisle.

10. The cooling unit of claim 1, wherein the main cooling section includes multiple main cooling modules, wherein the rear cooling section includes a rear cooling module, and wherein all of the main cooling modules and the rear cooling module are connected in series.

11. The cooling unit of claim 10, wherein a fluid outlet of one of the multiple main cooling modules is connected to a fluid inlet of another of the multiple main cooling modules or a fluid inlet of the rear cooling module.

12. The cooling unit of claim 10, wherein each of the multiple main cooling modules corresponds to one of the one or more main airstream diversion channels, and wherein each of the one or more main airstream diversion channels is configured to direct the airflow to a corresponding main cooling module.

\* \* \* \* \*